(12) United States Patent
Yun et al.

(10) Patent No.: US 8,476,627 B2
(45) Date of Patent: Jul. 2, 2013

(54) THIN-FILM TRANSISTOR, METHOD OF FABRICATING THE THIN-FILM TRANSISTOR, AND DISPLAY SUBSTRATE USING THE THIN-FILM TRANSISTOR

(76) Inventors: Pil-Sang Yun, Seoul (KR); Young-Wook Lee, Suwon-si (KR); Woo-Geun Lee, Yongin-si (KR)

( * ) Notice: Subject to any disclaimer, the term of this patent is extended or adjusted under 35 U.S.C. 154(b) by 53 days.

(21) Appl. No.: 13/046,130

(22) Filed: Mar. 11, 2011

(65) Prior Publication Data

US 2011/0227063 A1    Sep. 22, 2011

(30) Foreign Application Priority Data

Mar. 16, 2010   (KR) .................. 10-2010-0023367

(51) Int. Cl.
*H01L 29/786* (2006.01)
(52) U.S. Cl.
USPC   257/43; 257/53; 257/E29.273; 257/E33.062; 257/E27.112; 257/E27.131

(58) Field of Classification Search
USPC .................. 257/43, E29.273, E33.062
See application file for complete search history.

(56) References Cited

U.S. PATENT DOCUMENTS

2010/0159639 A1*   6/2010   Sakata .................. 438/104

\* cited by examiner

*Primary Examiner* — Lynne Gurley
*Assistant Examiner* — Tran Tran
(74) *Attorney, Agent, or Firm* — H.C. Park & Associates, PLC

(57) ABSTRACT

Provided is an oxide thin-film transistor (TFT) substrate that may enhance the display quality of a display device and a method of fabricating the same via a simple process. The oxide TFT substrate includes: a substrate, a gate line, a data line, an oxide TFT, and a pixel electrode. An oxide layer of the oxide TFT includes a first region that has semiconductor characteristics and a channel, and a second region that is conductive and surrounds the first region. A portion of the first region is electrically connected to the pixel electrode, and the second region is electrically connected to the data line.

26 Claims, 10 Drawing Sheets

THIN-FILM TRANSISTOR, METHOD OF FABRICATING THE THIN-FILM TRANSISTOR, AND DISPLAY SUBSTRATE USING THE THIN-FILM TRANSISTOR

CROSS REFERENCE TO RELATED APPLICATION

This application claims priority from and the benefit of Korean Patent Application No. 10-2010-0023367, filed on Mar. 16, 2010, which is hereby incorporated by reference for all purposes as if fully set forth herein.

BACKGROUND OF THE INVENTION

1. Field of the Invention

Exemplary embodiments of the present invention relate to a thin-film transistor (TFT) substrate and a method of fabricating the same and, more particularly, to a TFT using an oxide semiconductor and a method of fabricating the TFT.

2. Discussion of the Background

Thin-film transistors (TFTs) are used as switching elements in flat panel displays such as liquid crystal displays (LCDs) and organic light-emitting diode (OLED) displays. In a conventional LCD, a channel layer of a TFT is mostly an amorphous silicon layer. In this case, the TFT has a mobility of approximately 0.5 $cm^2/Vs$. However, as displays become larger, high resolution and high-frequency driving capabilities are required. Accordingly, a high-performance TFT with high mobility is in demand and research is being conducted on an oxide semiconductor layer having a higher mobility than the amorphous silicon layer. For example, a Ga—In—Zn—O layer has mobility of several tens of times greater than the mobility of an amorphous silicon layer, thus exhibiting excellent semiconductor characteristics.

Further, the ON current of a TFT is proportional to the mobility of a channel layer and the width of the channel layer and indirectly proportional to the length of the channel layer. Therefore, when an oxide semiconductor having high mobility is used for a TFT, the ON current of the TFT may be increased, depending on the physical attributes and semiconductor composition of the channel region.

SUMMARY OF THE INVENTION

Exemplary embodiments of the present invention provide a thin-film transistor (TFT) substrate having increased ON current by improving the design of a TFT.

Exemplary embodiments of the present invention also provide a display device with enhanced display quality that may be achieved by reducing parasitic capacitance existing in each pixel.

Exemplary embodiments of the present invention further provide a method that reduces the effort needed to perform alignment of layers that form a TFT in order to make the entire TFT substrate fabrication process easier.

Additional features of the invention will be set forth in the description which follows, and, in part, will be apparent from the description or may be learned by practice of the invention.

An exemplary embodiment of the present invention discloses an oxide thin-film transistor (TFT) substrate that comprises a substrate; a gate line disposed on the substrate; a data line disposed on the substrate and insulated from and intersecting the gate line; an oxide TFT electrically connected to the gate line and the data line; and a pixel electrode disposed on oxide TFT. An oxide layer of the oxide TFT comprises a first region with semiconductor characteristics and comprising a channel; and a second region that is conductive and surrounds the first region. The first region is electrically connected to the pixel electrode, and the second region is electrically connected to the data line.

An exemplary embodiment of the present invention also discloses an oxide thin-film transistor (TFT) substrate that comprises a substrate; a gate line disposed on the substrate; a data line disposed on the substrate and insulated from and intersecting the gate line; an oxide TFT electrically connected to the gate line and the data line; and a pixel electrode disposed on the oxide TFT. The oxide TFT comprises a gate electrode connected to the gate line; a gate insulating film covering the gate line and the gate electrode; an oxide layer disposed on the gate insulating film and overlapping the gate electrode; a first passivation film disposed on the oxide layer and partially overlapping the oxide layer; and a source electrode connected to the data line and partially overlapping the oxide layer. The oxide layer comprises a first region with semiconductor characteristics and comprising a channel; and a second region that is conductive and surrounds the first region. The first region is electrically connected to the pixel electrode, and the second region is electrically connected to the data line.

An exemplary embodiment of the present invention further discloses a method of fabricating an oxide TFT substrate. The method comprises disposing an oxide layer on a substrate; making conductive a second region of the oxide layer; and disposing a pixel electrode to contact a first region of the oxide layer. The second region surrounds the first region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE ILLUSTRATED EMBODIMENTS

Figure 1:
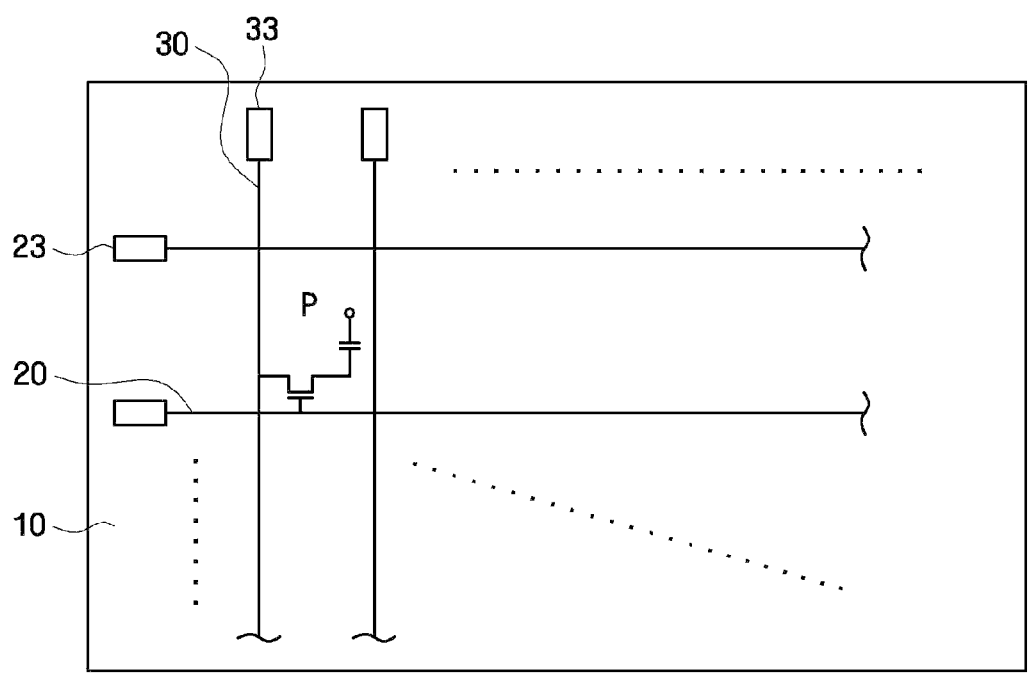
FIG. 1 is a plan view of a thin-film transistor (TFT) substrate according to an exemplary embodiment of the present invention.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present.

Hereinafter, a thin-film transistor (TFT) substrate according to an exemplary embodiment of the present invention will be described with reference to FIG. 1, FIG. 2, and FIG. 3.

FIG. 1 is a plan view of a TFT substrate according to an exemplary embodiment of the present invention. FIG. 2 is a plan view of one pixel of the TFT substrate shown in FIG. 1. FIG. 3 is a cross-sectional view taken along line III-III' of FIG. 2.

Referring to FIG. 1, the TFT substrate includes a plurality of gate lines 20 disposed on an insulating substrate 10 and a plurality of data lines 30, which are insulated from and intersect the gate lines 20. A pixel P is formed in a region in which each of the gate lines 20 intersects each of the data lines 30. The TFT substrate includes a plurality of pixels P. A gate pad 23 is connected to an end of each of the gate lines 20, and a data pad 33 is connected to an end of each of the data lines 30. In each of the pixels P, a TFT, which is connected to each of the gate lines 20 and each of the data lines 30, and a pixel electrode 80, which is connected to the TFT, are disposed.

Figure 2:
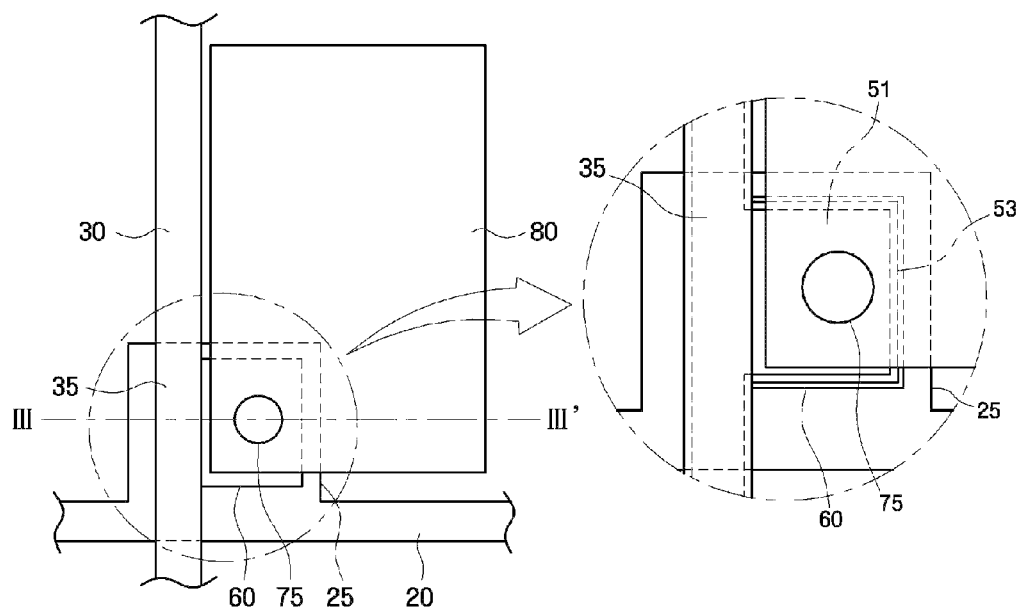
FIG. 2 is a plan view of one pixel of the TFT substrate shown in FIG. 1.
Figure 3:
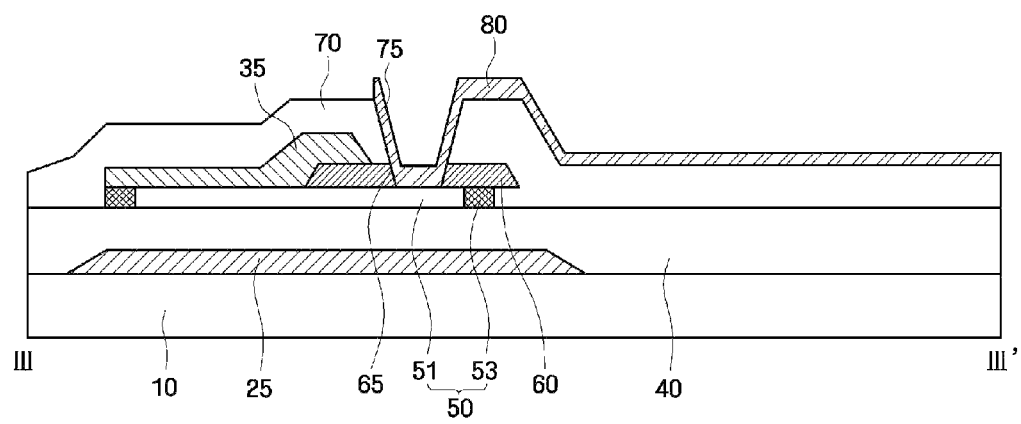
FIG. 3 is a cross-sectional view taken along line III-III' of FIG. 2.

Referring to FIG. 2 and FIG. 3, the TFT includes a gate electrode 25, a gate insulating film 40, an oxide layer 50, a first passivation film 60, and a source electrode 35. The gate electrode 25 is connected to the gate line 20, and the gate electrodes 25 and the gate line 20 and form a gate pattern. The gate insulating film 40 covers the gate pattern, and the oxide layer 50 is disposed on the gate insulating film 40 and overlaps the gate electrode 25. The first passivation film 60 is disposed on the oxide layer 50, and the source electrode 35 partially overlaps the oxide layer 50 and the first passivation film 60 and is connected to each of the data lines 30. The source electrode 35 may be formed as a separate pattern. Alternatively, a portion of each of the data lines 30 may function as a source electrode as is described below.

A second passivation film 70 is disposed on the TFT, and the pixel electrode 80 is disposed on the second passivation film 70. The pixel electrode 80 contacts the oxide layer 50 through a first hole 65 formed in the first passivation film 60 and a second hole 75 formed in the second passivation film 70.

The gate insulating film 40 may be formed as a single silicon oxide (SiOx) film or a double film including silicon nitride (SiNx) and SiOx. When the gate insulating film 40 is formed as a double film, it is desirable for a SiOx film to be disposed adjacent to the oxide layer 50.

The first passivation film 60 functions as an etch stopper layer and protects a channel region of the oxide layer 50 when the source electrode 35 is patterned. The first passivation film 60 may be, for example, a SiOx layer.

In the current exemplary embodiment, the second passivation film 70 may be made of an insulating film containing, e.g., SiNx.

The oxide layer 50 may be made of an amorphous oxide containing at least one of indium (In), zinc (Zn), gallium (Ga), and hafnium (Hf). For example, the oxide layer 50 may include a Zn oxide or an In—Zn composite oxide with added Ga or Hf. Specifically, the amorphous oxide layer 50 may be a Ga—In—Zn—O layer existing in a form of $In_2O_3$—$Ga_2O_3$—ZnO or may be an Hf—In—Zn—O layer existing in a form of $HfO_2$—$In_2O_3$—ZnO.

The oxide layer 50 includes a first region 51, which has semiconductor characteristics, and a second region 53, which surrounds the first region 51 and is conductive. The second region 53 is connected to the source electrode 35. In the current exemplary embodiment, the second region 53 is a region of the oxide layer 50 that adjoins the second passivation film 70. In other words, the second region 53 is a region of the oxide layer 50 that is close to a boundary of the first passivation film 60.

The second passivation film 70 may be deposited on the substrate 10 by using, e.g., a chemical vapor deposition (CVD) method. Generally, a hydrogen-containing gas is used as a reaction gas in the process of depositing SiNx in the CVD method. Here, hydrogen in the hydrogen-containing gas changes characteristics of a region of the oxide layer 50 that is adjacent to the SiNx containing layer, i.e., the second passivation film 70. That is, the region of the oxide layer 50, which is adjacent to the SiNx, becomes conductive. On the other hand, the other region of the oxide layer 50, which is not adjacent to the second passivation film 70, maintains its semiconductor characteristics.

As in the current exemplary embodiment, if a region of the oxide layer 50, which is adjacent to the second passivation film 70, is an edge of the oxide layer 50, the second region 53 is formed in the edge of the oxide layer 50 and surrounds the first region 51. That is, the oxide layer 50 is divided into the first region 51, which has semiconductor characteristics, and the second region 53, which surrounds the first region 51 and is conductive.

As described above, the second region 53 is connected to the source electrode 35. Thus, a signal input to each of the data lines 30 may reach the second region 53 via the source electrode 35. That is, the second region 53 may function as another source electrode separate from the source electrode 35. When no source electrode is formed, the second region 53 may function as a source electrode together with a portion of each of the data lines 30 that contacts the oxide layer 50.

Referring to FIG. 2 and FIG. 3, the first hole 65 and the second hole 75 are formed at a location corresponding to a portion of the first region 51. That is, a portion of the first region 51 is exposed by the first hole 65 and the second hole 75.

As described above, the pixel electrode 80 contacts the first region 51 through the first and second holes 65 and 75. Thus, there may be no need to form an additional pattern for forming a drain electrode. Consequently, the second region 53 functions as a source electrode. A portion of the first region 51, which contacts the pixel electrode 80, functions as a drain electrode, and the other portion of the first region 51, which does not contact the pixel electrode 80, functions as a channel.

The structure of the TFT according to the present exemplary embodiment may reduce parasitic capacitance between a gate pattern and a drain electrode. The parasitic capacitance may be one of the causes of image quality defects such as flickering. Therefore, a reduction in the parasitic capacitance may result in an improvement in the display quality of a display device.

The structure of the TFT according to the present exemplary embodiment also reduces the length of the channel while increasing the width of the channel, thereby increasing the ON current of the TFT.

Figure 4:
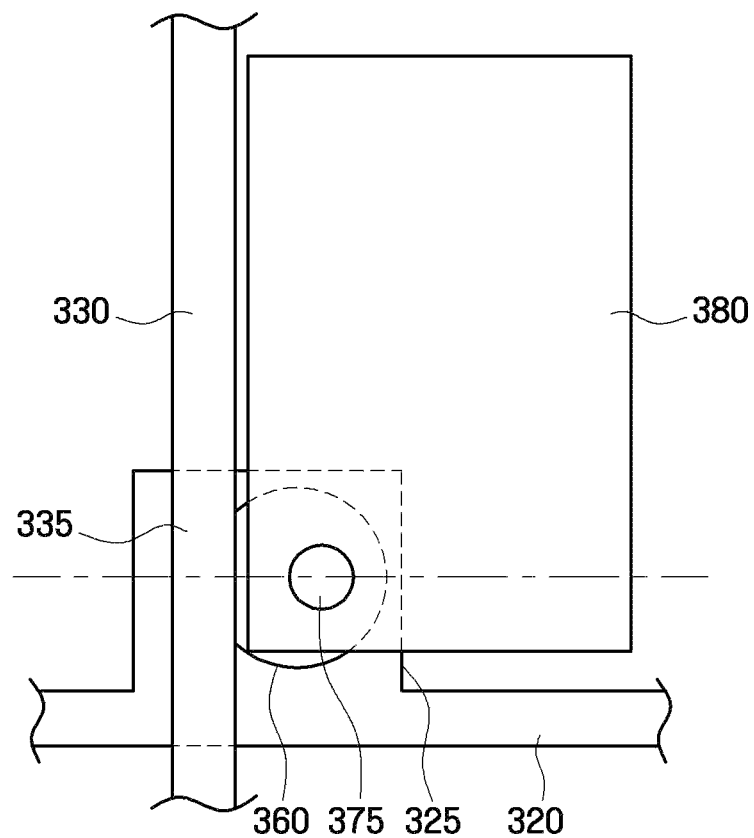
FIG. 4 and FIG. 5 are plan views of exemplary modified shapes of TFTs of the TFT substrate shown in FIG. 1.
Figure 5:
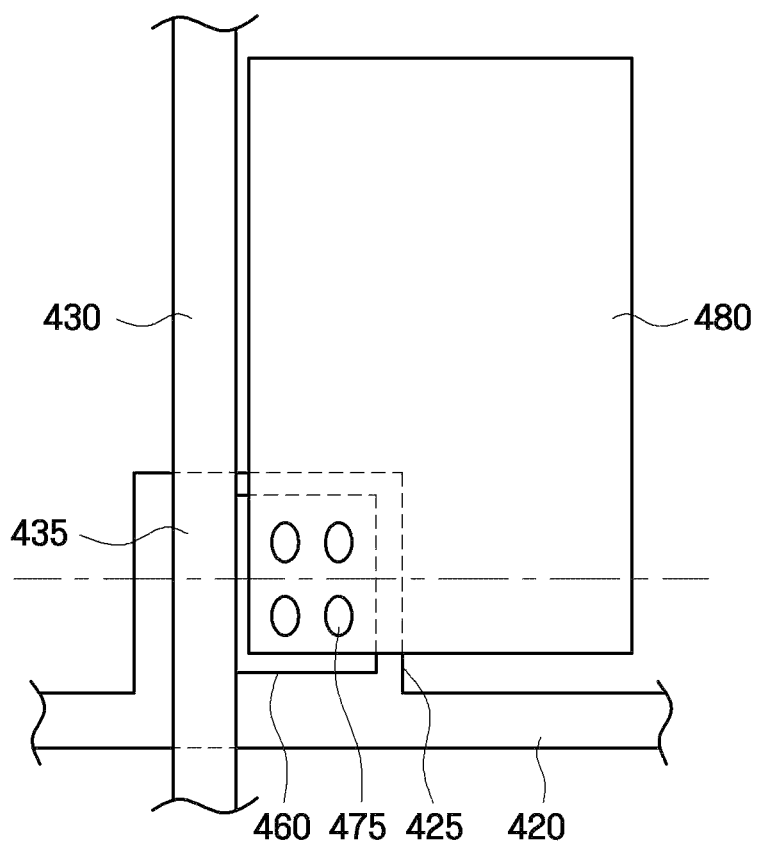

The shape of the TFT according to the current exemplary embodiment is not limited to the shape shown in FIG. 2 and FIG. 3 with the TFT having the above-described features. For example, an oxide layer (not shown) and a first passivation film 360 may be circular as shown in FIG. 4. Alternatively, a plurality of first holes (not shown) and a plurality of second holes 475 may be formed in a first region of an oxide layer as shown in FIG. 5.

Hereinafter, a TFT substrate according to another exemplary embodiment of the present invention is described with reference to FIG. 6 and FIG. 7. For simplicity, a description of structures and functions identical to those of the previous exemplary embodiment is omitted.

Figure 6:
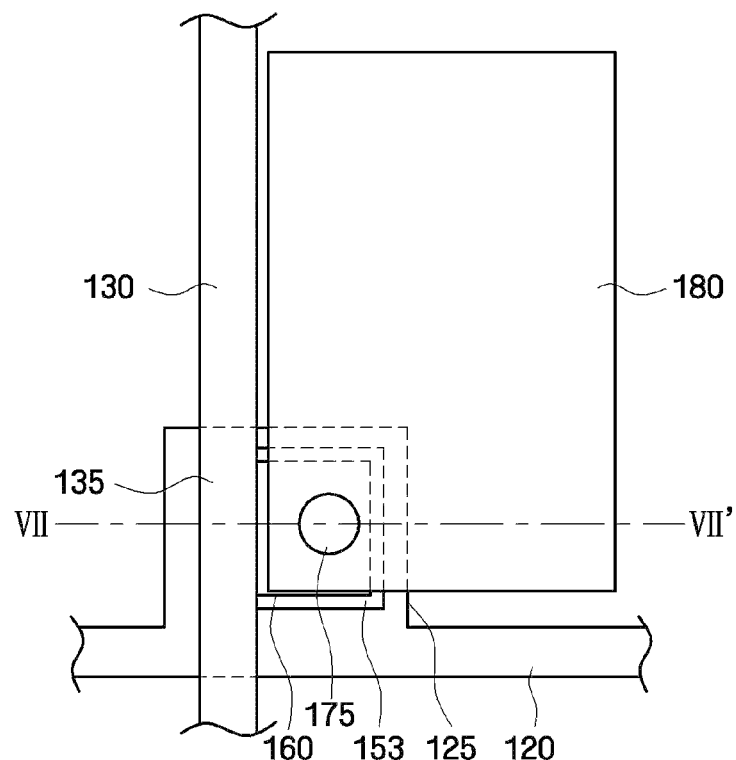
FIG. 6 is a plan view of one pixel of a TFT substrate according to another exemplary embodiment of the present invention.

FIG. 6 is a plan view of one pixel of a TFT substrate according to another exemplary embodiment of the present invention. FIG. 7 is a cross-sectional view taken along line VII-VII' of FIG. 6.

Figure 7:
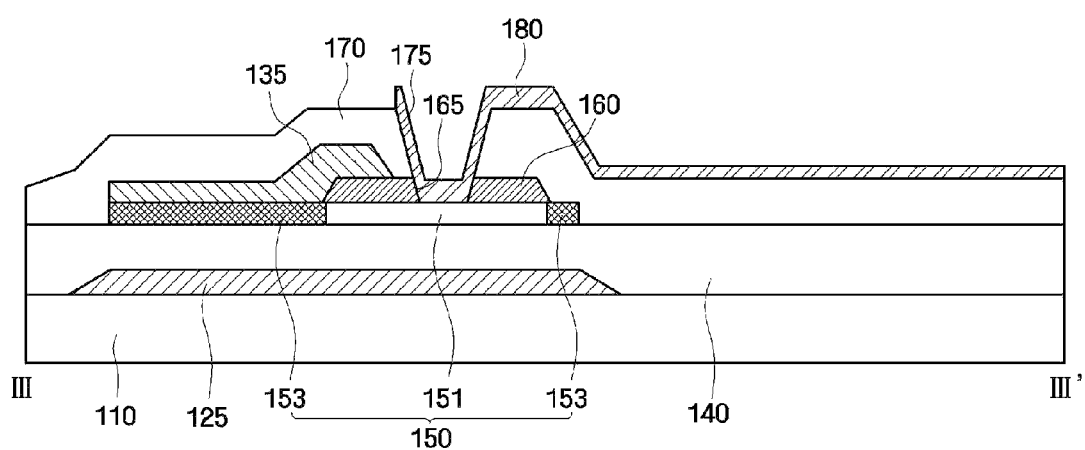
FIG. 7 is a cross-sectional view taken along line VII-VII' of FIG. 6.

Referring to FIG. 6 and FIG. 7, the TFT substrate includes a gate line 120 disposed on an insulating substrate 110, a data line 130 insulated and intersecting the gate line 120, a TFT connected to each of the gate line 120 and the data line 130, and a pixel electrode 180 connected to the TFT.

The TFT includes a gate electrode 125 connected to the gate line 120 and forming a gate pattern together with the gate line 120, an insulating film 140 that covers the gate pattern, an oxide layer 150 disposed on the gate insulating film 140 and overlapping the gate electrode 125, a first passivation film 160 disposed on the oxide layer 150, and a source electrode 135 partially overlapping the oxide layer 150 and the first passivation film 160 and connected to the data line 130.

The source electrode 135 may be formed as a separate pattern. Alternatively, a portion of the data line 130 may function as a source electrode as described above in the previous exemplary embodiment.

A second passivation film 170 is disposed on the TFT, and the pixel electrode 180 is disposed on the second passivation film 170. The pixel electrode 180 contacts the oxide layer 150 through a first hole 165 formed in the first passivation film 160 and a second hole 175 formed in the second passivation film 170.

The first passivation film 160 functions as an etch stopper layer and protects a channel region of the oxide layer 150 when the source electrode 135 is patterned. The first passivation film 160 may be, for example, an SiOx layer.

In the current exemplary embodiment, the second passivation film 170 may be made of the same material as the first passivation film 160, for example, SiOx.

The oxide layer 150 may be made of the same material as the oxide layer 50 of the previous exemplary embodiment. The oxide layer 150 includes a first region 151, which has semiconductor characteristics, and a second region 153, which surrounds the first region 151 and is conductive. The second region 153 is connected to the source electrode 135 or a portion of the data line 130.

If the second passivation film 170 is formed using SiOx, characteristics of the oxide layer 150 are not greatly affected by the deposition of the second passivation film 170, unlike in the previous exemplary embodiment. That is, the deposition of the second passivation film 170 may not impart conductivity to a region of the oxide layer 150, and the second region 153 may be formed using an additional process.

The additional process may be performing a hydrogen plasma treatment on the oxide layer 150 by using the first passivation film 160 as a mask. In this case, a region of the oxide layer 150 that overlaps the first passivation film 160 may not be substantially hydrogen plasma-treated, i.e., a portion of the oxide layer 150 corresponding to the first region 151 may be unaffected by the hydrogen plasma treatment. Thus, the region maintains its semiconductor characteristics. On the other hand, the other region of the oxide layer 150 that is not overlapped by the first passivation film 160 may become conductive as a result of the hydrogen plasma treatment. Therefore, the second region 153 of the oxide layer 150 is formed near a boundary of the first passivation film 160, outside the first passivation film 160. That is, the second region 153 protrudes outwards from the first passivation film 160.

Since the pixel electrode 180 contacting the first region 151 through the first and second holes 165 and 175 has been described above in the previous exemplary embodiment, a description of it is omitted below.

As in the previous exemplary embodiment, the shape of the TFT and the numbers of the first and second holes 165 and 175 may vary.

Hereinafter, a method of fabricating a TFT substrate according to an exemplary embodiment of the present invention will be described.

FIG. 8A, FIG. 8B, FIG. 8C, FIG. 8D, and FIG. 8E are cross-sectional views of a substrate and layers formed by a method of fabricating a TFT substrate according to an exemplary embodiment of the present invention.

Figure 8A:
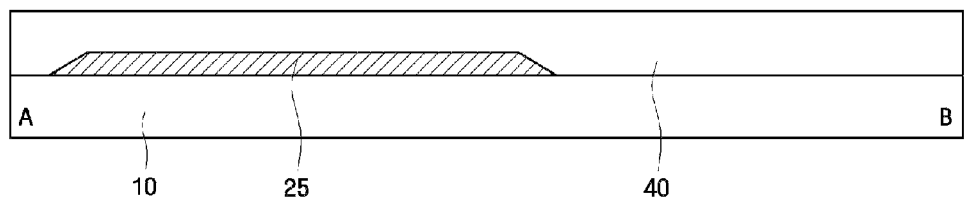
FIG. 8A, FIG. 8B, FIG. 8C, FIG. 8D, and FIG. 8E are cross-sectional views of a substrate and layers formed by a method of fabricating a TFT substrate according to an exemplary embodiment of the present invention.

Referring to FIG. 8A, a gate pattern including a gate electrode 25 is formed on a substrate 10. Then, a gate insulating film 40 is formed on the substrate 10 to cover the gate pattern and gate electrode 25. The gate insulating film 40 may be formed by forming a single layer of SiOx on the substrate 10 or by successively depositing SiNx and SiOx on the substrate 10.

Figure 8B:
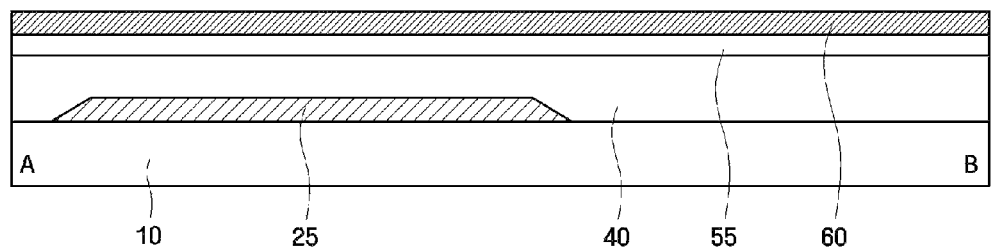

Referring to FIG. 8B, an oxide 55 is deposited on the gate insulating film 40 by physical vapor deposition (PVD), CVD, atomic layer deposition (ALD), or a solution process. The oxide 55 may be made of an amorphous oxide containing at least one of In, Zn, Ga, and Hf. For example, if a Ga—In—Zn—O oxide layer is formed by sputtering, targets of $In_2O_3$, $Ga_2O_3$ and ZnO or a single target of a Ga—In—Zn oxide may be used. In addition, if an Hf—In—Zn—O oxide layer is formed by sputtering, targets of $HfO_2$, $In_2O_3$, and ZnO or a single target of an Hf—In—Zn oxide may be used.

Next, an SiOx layer is deposited on the oxide 55 and then patterned to form a first passivation film 60 as shown in FIG. 8B. Here, the SiOx layer may be patterned by, e.g., dry etching.

Figure 8C:
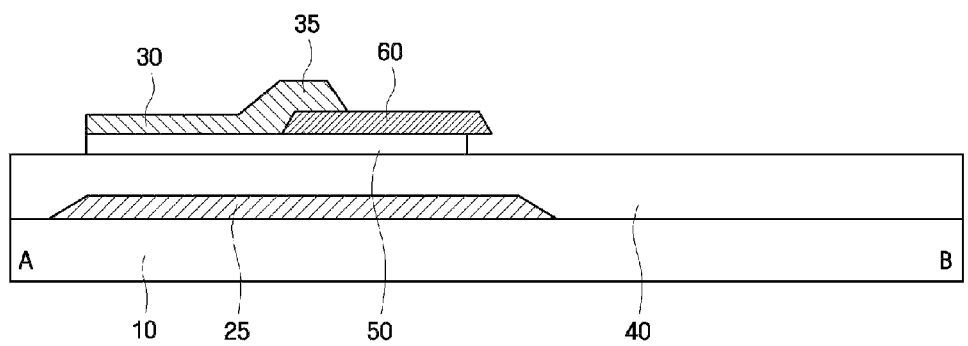

Referring to FIG. 8C, a metal layer (not shown) is deposited on the substrate 10. Then, the metal layer and the oxide are patterned together, thereby forming a data line 30, a source electrode 35, and an oxide layer 50. Here, the metal layer and the oxide 55 may be patterned by wet etching. The oxide layer 50 is formed under the data line 30, the source electrode 35, and the first passivation film 60. That is, the source electrode 35 partially overlaps the oxide layer 50 and the first passivation film 60. The metal layer may be a single layer or a multilayer containing at least one of aluminum (Al), molybdenum (Mo), titanium (Ti), and copper (Cu).

In the current exemplary embodiment, the oxide 55 and the metal layer are patterned using one mask. However, the oxide 55 and the metal layer may also be patterned using separate masks. In this case, the oxide layer 50 may not be disposed under the data line 30.

Figure 8D:
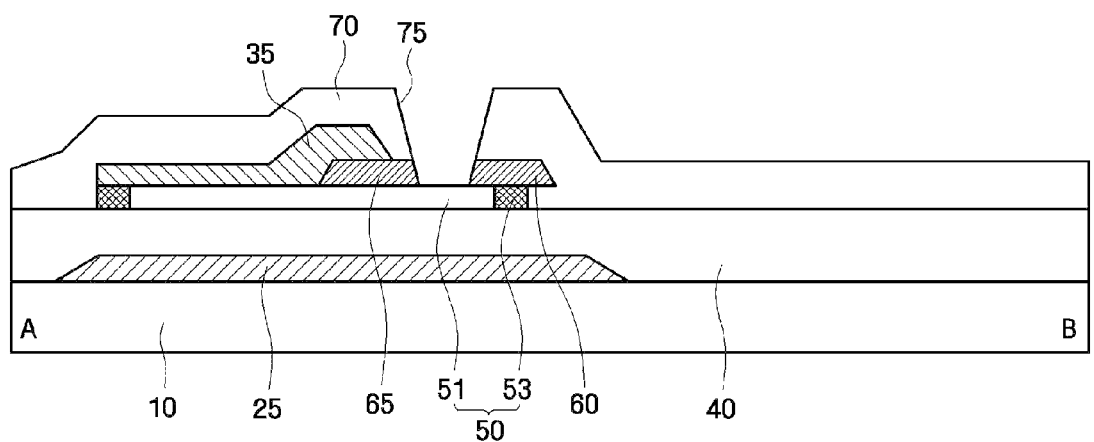

Referring to FIG. 8D, an SiNx layer is deposited on the whole surface of the substrate 10 by, e.g., CVD, to form a second passivation film 70. In the process of depositing the SiNx layer using CVD, a reactive gas such as $SiH_4$, $NH_3$, and H2 is used. If these hydrogen-containing gases are used as a reaction gas to deposit the SiNx layer, characteristics of a region of the oxide layer 50, which is adjacent to the second passivation film 70, are changed by hydrogen in the hydrogen-containing gas. That is, the region of the oxide layer 50, which is adjacent to the second passivation film 70, becomes conductive. On the other hand, the other region of the oxide layer 50, which is not adjacent to the second passivation film 70, maintains its semiconductor characteristics. In FIG. 8D, since an edge region of the oxide layer 50 is adjacent to the second passivation film 70, it becomes conductive.

From a different point of view, a region of the oxide layer 50 that is close to a boundary of the first passivation film 60 may become conductive. Consequently, a conductive second region 53 of the oxide layer 50 may surround a first region 51 having semiconductor characteristics.

The second passivation film 70 and the first passivation film 60 are patterned to form a second hole 75 and a first hole 65, respectively. The first and second holes 65 and 75 are formed at the same position and expose a portion of the first region 51 of the oxide layer 50. The first and second holes 65 and 75 may be formed using a single etching process.

Figure 8E:
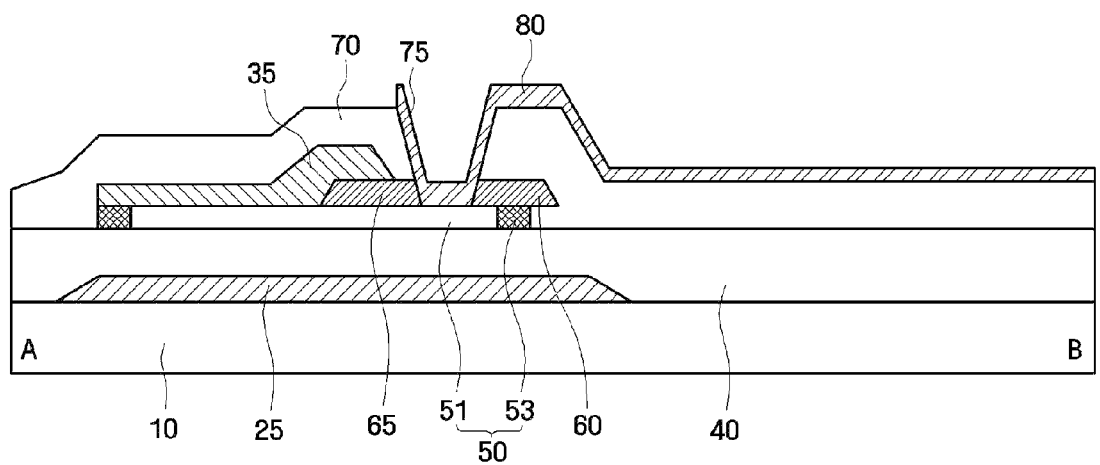

Referring to FIG. 8E, a transparent conductive layer is formed on the second passivation film 70 and then patterned to form a pixel electrode 80. The pixel electrode 80 contacts the first region 51 of the oxide layer 50 through the first and second holes 65 and 75. That is, a portion of the first region 51 of the oxide layer 50 that contacts the pixel electrode 80 functions as a drain electrode.

Therefore, according to the present exemplary embodiment, a separate pattern for forming a drain electrode is not needed since a portion of the first region 51 performs this function. Consequently, the alignment of the source electrode 35 with a drain electrode is unnecessary, and only the alignment of the oxide layer 50 with the first and second holes 65 and 75 needs to be considered. Thus, alignment efforts may be reduced, simplifying the overall fabrication process.

Hereinafter, a method of fabricating a TFT substrate according to another exemplary embodiment of the present invention is described. For simplicity, a detailed description of constructions identical to those of the method of fabricating the TFT substrate according to the previous exemplary embodiments is omitted.

FIG. 9A, FIG. 9B, FIG. 9C, FIG. 9D, FIG. 9E, and FIG. 9F are cross-sectional views of a substrate and layers formed by a method of fabricating a TFT substrate according to another exemplary embodiment of the present invention.

Figure 9A:
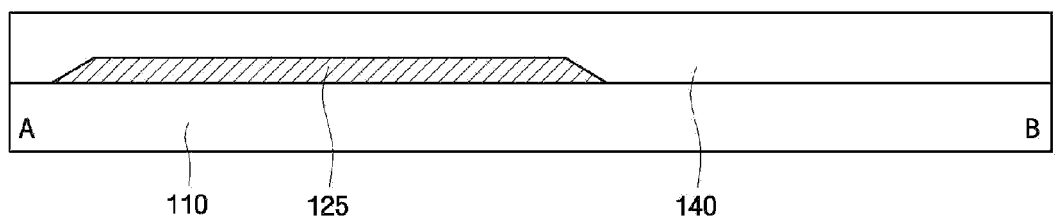
FIG. 9A, FIG. 9B, FIG. 9C, FIG. 9D, FIG. 9E, and FIG. 9F are cross-sectional views of a substrate and layers formed by a method of fabricating a TFT substrate according to another exemplary embodiment of the present invention.
Figure 9B:
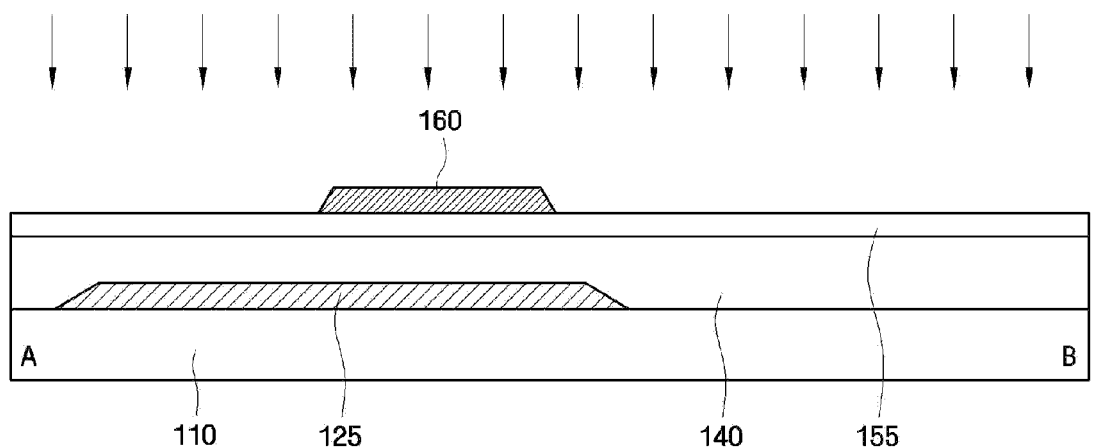

Referring to FIG. 9A and FIG. 9B, the processes performed up until a first passivation film 160 is formed on an oxide 155 are the same as those according to the previous exemplary embodiment.

Figure 9C:
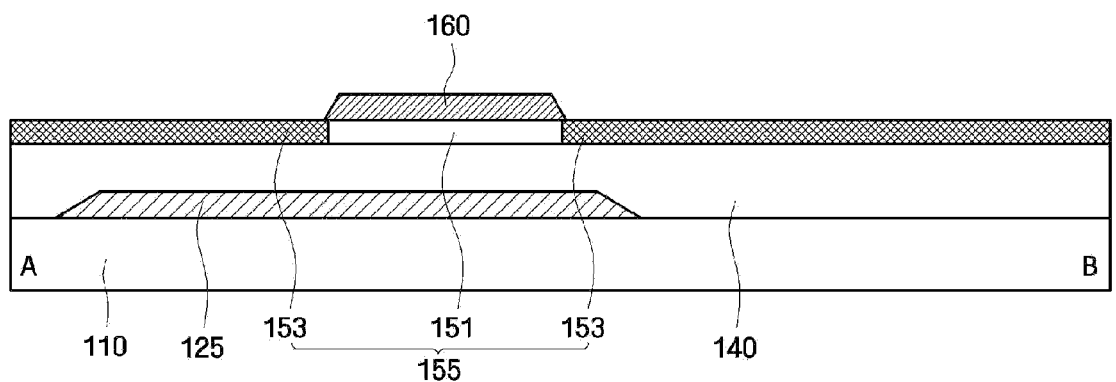

Referring to FIG. 9B and FIG. 9C, the oxide 155 is hydrogen plasma-treated while using the first passivation film 160 as a mask. The hydrogen plasma treatment imparts conductivity in a portion of the oxide 155 except for a region covered by the first passivation film 160. The region of the oxide 155 that is covered by the first passivation film 160 maintains its semiconductor characteristics.

In this way, in the current exemplary embodiment, conductivity is given to the oxide 155 in an additional process step. Thus, higher conductivity may be obtained as compared with the previous exemplary embodiment.

Figure 9D:
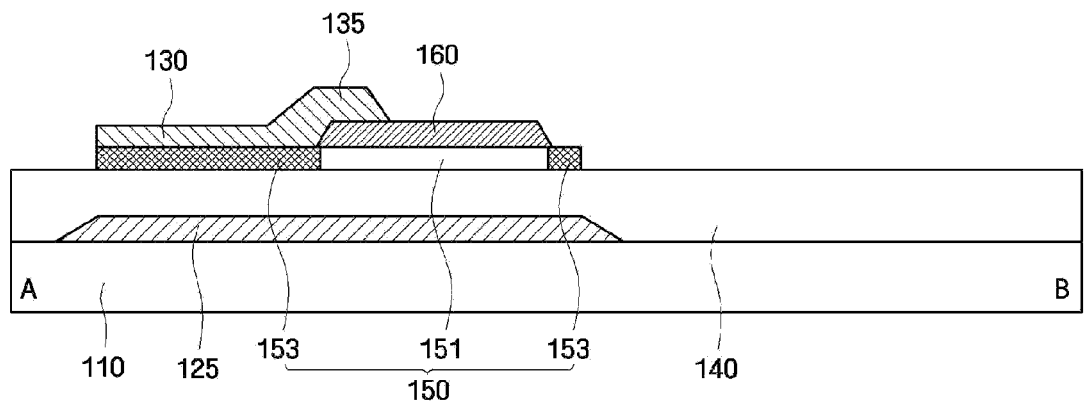

Referring to FIG. 9D, after a metal layer (not shown) is deposited on the substrate 110, the metal layer and the oxide 155 are simultaneously patterned using one mask, thereby forming a data line 130, a source electrode 135, and an oxide layer 150. The oxide layer 150 is formed under the data line 130, the source electrode 135, and the first passivation film 160. That is, the source electrode 135 partially overlaps the oxide layer 150 and the first passivation film 160.

The oxide layer 150 has, in part, semiconductor characteristics and is divided into a first region 151, which is disposed under the first passivation film 160, and a second region 153, which is conductive and surrounds the first region 151. As shown in FIG. 9D, the second region 153 may contact a wider area of the source electrode 135 or the data line 130 in the current exemplary embodiment. In addition, the second region 153 may protrude outwardly from the first passivation film 160 unlike the second region 53 formed according to the previous exemplary embodiment.

As in the previous exemplary embodiment, the oxide 55 and the metal layer may be patterned using separate masks in the current exemplary embodiment.

Figure 9E:
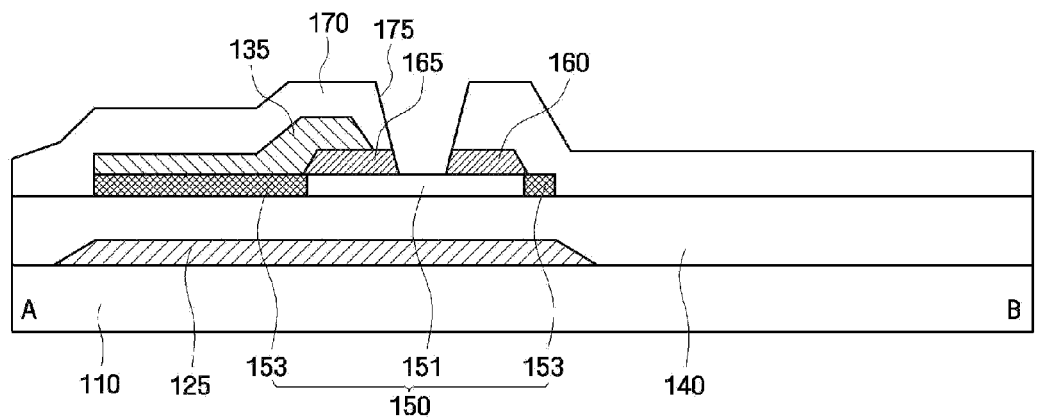
Figure 9F:
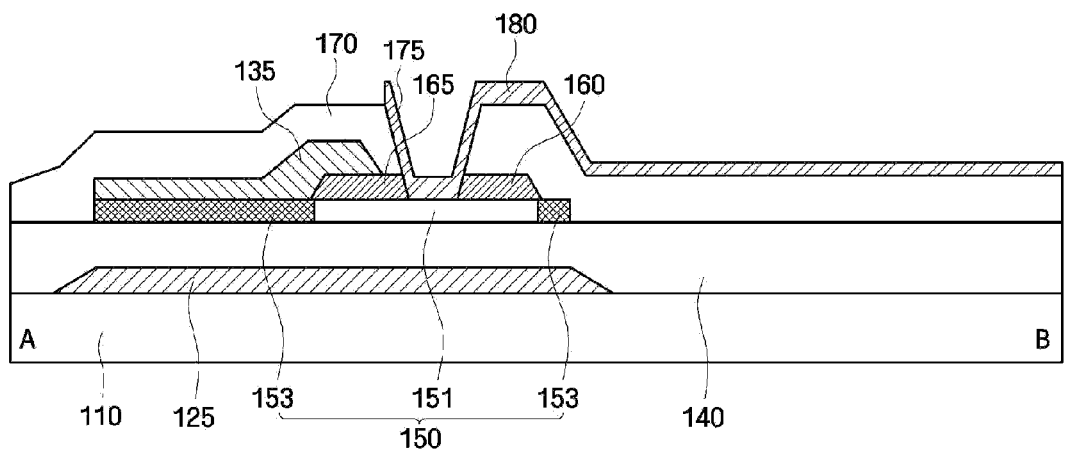

Referring to FIG. 9E and FIG. 9F, a second passivation film 170, first and second holes 165 and 175, and a pixel electrode 180 contacting the first region 151 through the first and second holes 165 and 175 are formed using the same processes as those described above with regard to processing the substrate in the previous exemplary embodiment.

As described herein with respect to exemplary embodiments of the present invention, a channel layer is formed using an oxide semiconductor, thereby increasing mobility of the TFT. In addition, a TFT substrate having an increased ON current may be provided by reducing the length of a channel of the TFT while increasing the width of the channel.

Since parasitic capacitance, which degrades display quality, may be reduced by the absence of a separate drain electrode, the display quality of a display device may be improved.

Furthermore, since efforts for the alignment of layers that form the TFT may be reduced, the entire TFT substrate fabrication process is simplified.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An oxide thin-film transistor (TFT) substrate, comprising:
   a substrate;
   a gate line disposed on the substrate;
   a data line disposed on the substrate and insulated from and intersecting the gate line;
   an oxide TFT electrically connected to the gate line and the data line; and
   a pixel electrode electrically connected to the oxide TFT,
   wherein an oxide layer of the oxide TFT comprises:
      a first region with semiconductor characteristics and comprising a channel; and
      a second region that is conductive and surrounds the first region,
      wherein the first region is electrically connected to the pixel electrode, and the second region is electrically connected to the data line.

2. The oxide TFT substrate of claim 1, further comprising:
a first passivation film disposed on the oxide layer and comprising a first hole exposing the first region; and
a second passivation film disposed on the first passivation film and comprising a second hole exposing the first hole and the first region,
wherein the pixel electrode is disposed on the second passivation film and contacts the first region through the first hole and the second hole.

3. The oxide TFT substrate of claim 2, wherein the first passivation film and the second passivation film comprise different materials from each other.

4. The oxide TFT substrate of claim 3, wherein the first passivation film comprises silicon oxide (SiOx), and the second passivation film comprises silicon nitride (SiNx).

5. The oxide TFT substrate of claim 2, wherein the first passivation film and the second passivation film comprise the same material.

6. The oxide TFT substrate of claim 5, wherein the first passivation film and the second passivation film comprise silicon oxide (SiOx).

7. The oxide TFT substrate of claim 2, wherein the number of first holes is greater than one, and the number of second holes is greater than one.

8. The oxide TFT substrate of claim 2, wherein the oxide layer comprises an amorphous oxide comprising at least one of indium (In), zinc (Zn), gallium (Ga), hafnium (Hf), or any combination thereof.

9. The oxide TFT substrate of claim 8, wherein the amorphous oxide comprises In, Zn, and Ga.

10. The oxide TFT substrate of claim 8, wherein the amorphous oxide comprises In, Zn, and Hf.

11. An oxide thin-film transistor (TFT) substrate, comprising:
a substrate;
a gate line disposed on the substrate;
a data line disposed on the substrate and insulated from and intersecting the gate line;
an oxide TFT electrically connected to the gate line and the data line; and
a pixel electrode electrically connected on the oxide TFT,
wherein the oxide TFT comprises:
a gate electrode connected to the gate line;
a gate insulating film disposed on the gate line and the gate electrode;
an oxide layer disposed on the gate insulating film and overlapping the gate electrode;
a first passivation film disposed on the oxide layer and partially overlapping the oxide layer; and
a source electrode connected to the data line and partially overlapping the oxide layer,
wherein the oxide layer comprises:
a first region with semiconductor characteristics and comprising a channel; and
a second region that is conductive and surrounds the first region,
wherein the first region is electrically connected to the pixel electrode, and the second region is electrically connected to the data line.

12. The oxide TFT substrate of claim 11, further comprising a second passivation film disposed between the oxide TFT and the pixel electrode, wherein the pixel electrode contacts the first region through a first hole in the first passivation film that exposes the first region and a second hole in the second passivation film that exposes the first hole and the first region.

13. The oxide TFT substrate of claim 12, wherein the first passivation film and the second passivation film comprise different materials from each other.

14. The oxide TFT substrate of claim 13, wherein the first passivation film comprises silicon oxide (SiOx), and the second passivation film comprises silicon nitride (SiNx).

15. The oxide TFT substrate of claim 12, wherein the first passivation film and the second passivation film comprise the same material.

16. The oxide TFT substrate of claim 15, wherein the first passivation film and the second passivation film comprise silicon oxide (SiOx).

17. The oxide TFT substrate of claim 12, wherein the number of first holes is greater than one, and the number of second holes is greater than one.

18. The oxide TFT substrate of claim 12, wherein the oxide layer comprises an amorphous oxide comprising at least one of indium (In), zinc (Zn), gallium (Ga), hafnium (Hf), or any combination thereof.

19. The oxide TFT substrate of claim 18, wherein the amorphous oxide comprises In, Zn, and Ga.

20. The oxide TFT substrate of claim 18, wherein the amorphous oxide comprises In, Zn, and Hf.

21. The oxide TFT substrate of claim 1, wherein the second region is contiguous.

22. The oxide TFT substrate of claim 1, wherein the second region completely surrounds the first region.

23. The oxide TFT substrate of claim 11, wherein the second region is contiguous.

24. The oxide TFT substrate of claim 11, wherein the second region completely surrounds the first region.

25. The oxide TFT substrate of claim 1, wherein pixel electrode physically contacts the first region.

26. The oxide TFT substrate of claim 11, wherein pixel electrode physically contacts the first region.

* * * * *